(12) United States Patent
Ding et al.

(10) Patent No.: US 8,279,572 B2
(45) Date of Patent: Oct. 2, 2012

(54) STRUCTURE FOR AN ON-CHIP HIGH FREQUENCY ELECTRO-STATIC DISCHARGE DEVICE

(75) Inventors: Hanyi Ding, Essex Junction, VT (US); Kai D. Feng, Hopewell Junction, NY (US); Zhong-Xiang He, Essex Junction, VT (US); Xuefeng Liu, South Burlington, VT (US); Anthony K. Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 1134 days.

(21) Appl. No.: 12/144,095

(22) Filed: Jun. 23, 2008

(65) Prior Publication Data

US 2009/0316314 A1 Dec. 24, 2009

(51) Int. Cl.
*H02H 9/02* (2006.01)
(52) U.S. Cl. .......................... 361/112; 361/56
(58) Field of Classification Search .................... 361/112
See application file for complete search history.

(56) References Cited

U.S. PATENT DOCUMENTS

| | | | |
|---|---|---|---|
| 4,531,176 A | 7/1985 | Beecher, II | |
| 5,697,799 A | 12/1997 | Consoli et al. | |
| 5,786,613 A * | 7/1998 | Kalnitsky | 257/355 |
| 5,796,638 A * | 8/1998 | Kang et al. | 716/112 |
| 5,990,519 A | 11/1999 | Huang-Lu et al. | |
| 6,121,954 A | 9/2000 | Seffernick | |
| 6,204,549 B1 | 3/2001 | Igel et al. | |
| 6,406,948 B1 | 6/2002 | Jun et al. | |
| 6,515,488 B1 | 2/2003 | Thomas | |
| 6,661,576 B2 | 12/2003 | Pinto | |
| 6,826,828 B1 | 12/2004 | Shen | |
| 6,916,188 B2 | 7/2005 | Lang et al. | |
| 7,196,406 B2 | 3/2007 | Kuzmenka | |
| 7,256,976 B2 | 8/2007 | Sato | |
| 7,295,590 B2 | 11/2007 | Crews | |
| 7,535,105 B2 | 5/2009 | Voldman | |
| 7,671,442 B2 * | 3/2010 | Anderson et al. | 257/522 |
| 2004/0243949 A1 * | 12/2004 | Wang et al. | 716/4 |
| 2005/0037604 A1 * | 2/2005 | Babich et al. | 438/619 |
| 2008/0299718 A1 * | 12/2008 | Jiang et al. | 438/197 |
| 2009/0091233 A1 | 4/2009 | Te-Pang | |

OTHER PUBLICATIONS

Ding et al., U.S. Appl. No. 12/144,084, filed Jun. 23, 2008, Notice of Allowance and Fee(s) Due dated Mar. 2, 2010, 11 pages.
Ding et al., U.S. Appl. No. 12/144,089, filed Jun. 23, 2008, Notice of Allowance and Fee(s) Due dated Mar. 10, 2010, 11 pages.
Ding et al., U.S. Appl. No. 12/144,071, filed Jun. 23, 2008, Office Communication dated Jul. 13, 2010, 14 pages.
Chambliss, Notice of Allowance and Fee(s) Due for U.S. Appl. No. 12/144,071 dated Nov. 23, 2010, 6 pages.

* cited by examiner

*Primary Examiner* — Rexford Barnie
*Assistant Examiner* — Ann Hoang
(74) *Attorney, Agent, or Firm* — Hoffman Warnick LLC; Anthony J. Canale

(57) ABSTRACT

A design structure for an on-chip high frequency electro-static discharge device is described. In one embodiment, the electro-static discharge structure comprises a first dielectric layer with more than one electrode formed therein. A second dielectric layer with more than one electrode formed therein is located above the first dielectric layer. At least one via connects the more than one electrode in the first dielectric layer with the more than one electrode in the second dielectric layer. A gap is formed through the first dielectric layer and the second dielectric layer, wherein the gap extends between two adjacent electrodes in both the first dielectric layer and the second dielectric layer. A third dielectric layer is disposed over the second dielectric layer, wherein the third dielectric layer hermetically seals the gap to provide electro-static discharge protection on the integrated circuit.

10 Claims, 19 Drawing Sheets

STRUCTURE FOR AN ON-CHIP HIGH FREQUENCY ELECTRO-STATIC DISCHARGE DEVICE

CROSS REFERENCE TO RELATED APPLICATIONS

This patent application relates to commonly-assigned U.S. patent application Ser. No. 12/144,089 entitled "METHOD FOR FORMING AN ON-CHIP HIGH FREQUENCY ELECTRO-STATIC DISCHARGE DEVICE", now U.S. Pat. No. 7,759,243, Ser. No. 12/144,071 entitled "METHOD FOR FORMING AN ON-CHIP HIGH FREQUENCY ELECTRO-STATIC DISCHARGE DEVICE", now U.S. Pat. No. 7,915,158, and Ser. No. 12/144,084 entitled "DESIGN STRUCTURE FOR AN ON-CHIP HIGH FREQUENCY ELECTRO-STATIC DISCHARGE DEVICE", now U.S. Pat. No. 7,768,762, all filed concurrently with this application.

FIELD OF THE INVENTION

This disclosure relates generally to integrated circuit design, and more specifically to a design structure for an electro-static discharge device fabricated on an integrated circuit.

BACKGROUND

As electronic components get smaller and smaller along with the internal structures in integrated circuits, it is becoming easier to either completely destroy or otherwise impair electronic components. In particular, many integrated circuits are highly susceptible to damage from the discharge of static electricity. Electro-static discharge (ESD) is the transfer of an electro-static charge between bodies at different electro-static potentials (voltages), caused by direct contact or induced by an electro-static field. The discharge of static electricity, or ESD, has become a critical problem for the electronics industry.

Device failures that result from ESD events are not always immediately catastrophic or apparent. Often, the device is only slightly weakened but is less able to withstand normal operating stresses and hence, may result in a reliability problem. Therefore, various ESD protection circuits must be included in the device to protect the various components.

Typical ESD protection circuits use an on-chip diode based ESD protection. These on-chip diode ESD devices work well for lower frequency currents but at higher frequency circuits such as millimeter wave circuits, these ESD protection circuits severely impair the performance of the millimeter wave circuits because of its inability to ameliorate the large parasitic capacitance that arises during the high operating frequency.

One approach that has been contemplated for overcoming the problems associated with using an on-chip diode ESD device for millimeter wave circuits is to use a matching circuit for ESD protection. However, the use of a matching circuit for ESD protection is a high risk solution because almost all matching circuits comprise inductances. Problems can arise when a high ESD current flows through the circuit. In particular, when a high ESD current flows through the circuit, the inductance generates high voltage which can damage input and output circuits.

SUMMARY

In one embodiment, there is an electro-static discharge protection device fabricated on an integrated circuit. In this embodiment, the electro-static discharge structure comprises a first dielectric layer with more than one electrode formed therein. A second dielectric layer with more than one electrode formed therein is located above the first dielectric layer. At least one via connects the more than one electrode in the first dielectric layer with the more than one electrode in the second dielectric layer. A gap is formed through the first dielectric layer and the second dielectric layer, wherein the gap extends between two adjacent electrodes in both the first dielectric layer and the second dielectric layer. A third dielectric layer is disposed over the second dielectric layer, wherein the third dielectric layer hermetically seals the gap to provide electro-static discharge protection on the integrated circuit.

In a second embodiment, there is a design structure of an on-chip electro-static discharge protection device embodied in a machine readable medium. In this embodiment, the design structure of the electro-static discharge protection device comprises a first dielectric layer with more than one electrode formed therein; a second dielectric layer with more than one electrode formed therein located above the first dielectric layer; at least one via connects the more than one electrode in the first dielectric layer with the more than one electrode in the second dielectric layer; a gap formed through the first dielectric layer and the second dielectric layer, wherein the gap extends between two adjacent electrodes in both the first dielectric layer and the second dielectric layer; and a third dielectric layer disposed over the second dielectric layer, wherein the third dielectric layer hermetically seals the gap to provide electro-static discharge protection on the integrated circuit.

In a third embodiment, there is an electro-static discharge protection device fabricated on an integrated circuit. In this embodiment, the electro-static discharge protection device comprises: a first dielectric layer with more than one electrode formed therein; a second dielectric layer with more than one electrode formed therein located above the first dielectric layer; a first capping layer disposed between the first dielectric layer and the second dielectric layer; at least one via connects the more than one electrode in the first dielectric layer through the first capping layer with the more than one electrode in the second dielectric layer; a gap formed through the first dielectric layer and the second dielectric layer, wherein the gap extends between two adjacent electrodes in both the first dielectric layer and the second dielectric layer and wherein the gap comprises a hard mask dielectric layer near a top portion of the second dielectric layer; a third dielectric layer disposed over the second dielectric layer, wherein the third dielectric layer hermetically seals the gap to provide electro-static discharge protection on the integrated circuit; and a second capping layer disposed between the second dielectric layer and the third dielectric layer.

DETAILED DESCRIPTION

Figure 1:
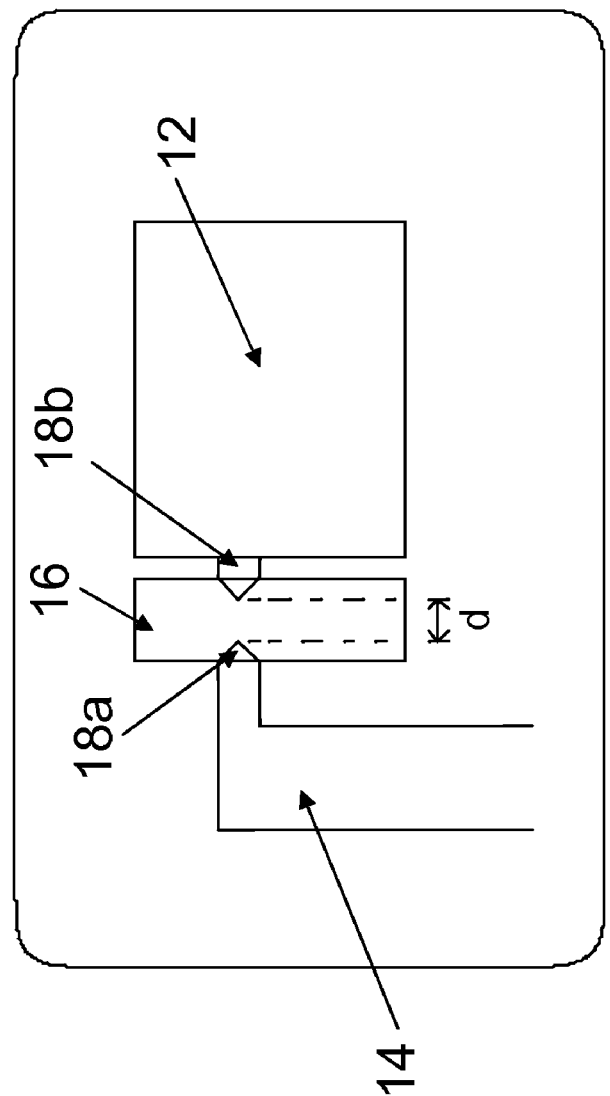
FIG. 1 shows a top-down view of an electro-static discharge device according to one embodiment of the disclosure.

FIG. 1 shows a top-down view of an electro-static discharge (ESD) device 10 according to one embodiment of the disclosure. As shown in FIG. 1, the ESD device 10 comprises a pad 12 which connects to components of a circuit such as a high frequency (e.g., a millimeter wave) circuit (not shown). A metal wire 14, separated by a gap 16, is adjacent to the pad 12. The metal wire 14 is a wire in the high frequency circuit (not shown) that is grounded by a substrate in the circuit (not shown). The gap 16 can be a vacuum gap or an air gap. Tips 18a and 18b protrude from the pad 12 and the metal wire 14, respectively, into the gap 16. Tips 18a and 18b can be made of copper, aluminum, tungsten or the like. As shown in FIG. 1, tips 18a and 18b have sharp tips and are separated from each other in the gap 16 by a distance denoted by d. Because the size of tips 18a and 18b can be designed to be as small as the minimum metal line width defined by a design rule, the parasitic capacitance can be ignored. Those skilled in the art will recognize that tips 18a and 18b can take on different shapes and that the distance d can vary depending on the amount of protection desired to ameliorate high voltage events (i.e., the distance d determines the ESD clamping voltage).

An ESD event (e.g., a high voltage) will enter the device 10 through the pad 12 (the pad is connected to the outside world) towards tips 18a and 18b. When the voltage applied to tips 18a and 18b exceeds the clamping voltage, a discharge occurs in the tips through the air gap such that the high voltage event is grounded through the metal wire 14 to the substrate. During the discharge, resistance is very low which keeps the voltage between the tips very low so that the underlying circuit can be protected. When the voltage is lower than the clamping voltage, then the discharge is over and tips 18a and 18b are resumed isolated.

Figure 2:
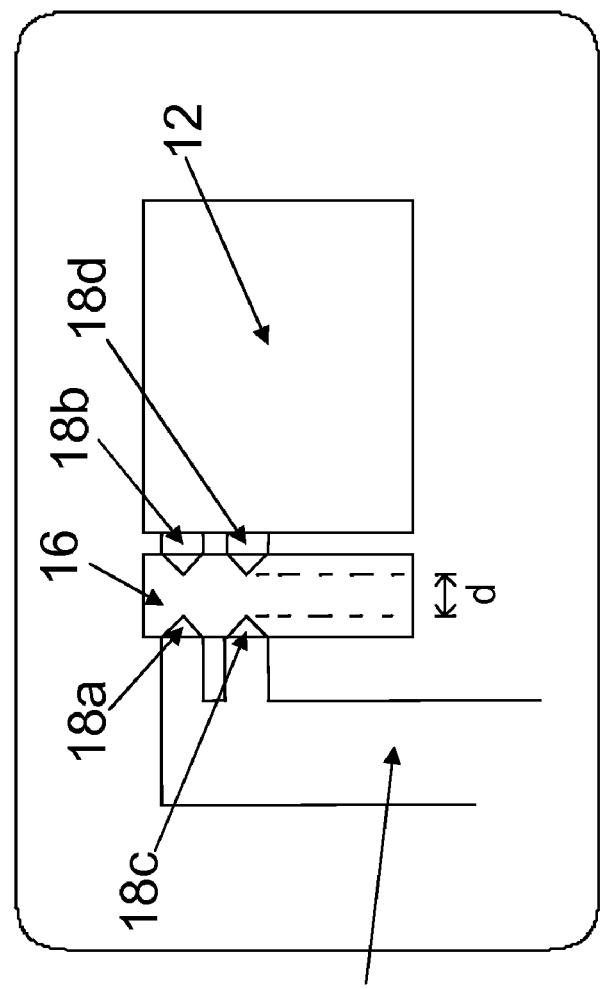
FIG. 2 shows a top-down view of an electro-static discharge device according to a second embodiment of the disclosure.

Those skilled in the art will recognize that the ESD device 10 shown in FIG. 1 is only one possible embodiment of implementing this concept and that other implementations are possible. For example, FIG. 2 shows a top-down view of an ESD device 19 according to a second embodiment of the disclosure. In particular, the ESD device 19 includes multiple tips 18a, 18b, 18c, and 18d. The ESD device 19 operates in a manner similar to the ESD device 10, except that multiple tips are used to discharge high voltage events. Although four tips are shown in FIG. 2, those skilled in the art will recognize that this only illustrative and that any reasonable number of tips can be used.

FIGS. 3-19 show the general process flow of forming an ESD according to one embodiment of this disclosure. In particular, FIGS. 3-19 generally pertain to a process of forming ESD device 10 depicted in FIG. 1, however, the description is suitable for fabricating ESD device 19. Those skilled in the art will recognize that forming ESD device 19 will require additional steps to produce the extra tips.

Figure 3:
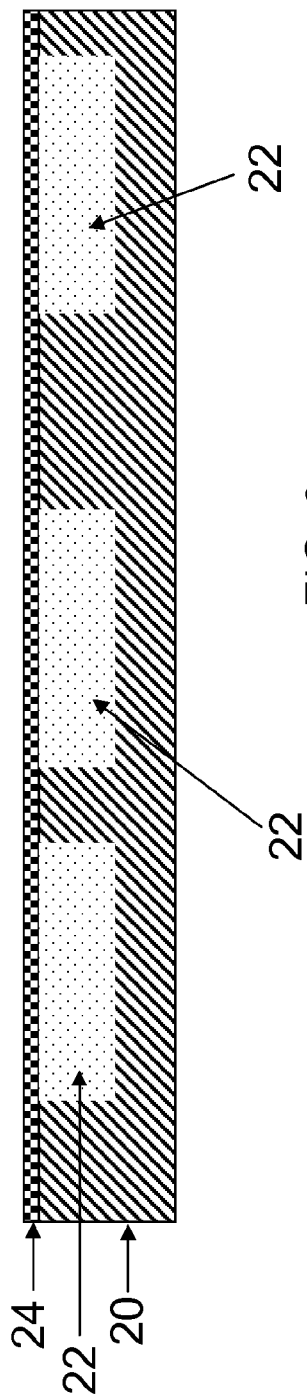
FIGS. 3-19 show the general process flow of forming the electro-static discharge devices depicted in FIGS. 1 and 2 according to one embodiment of this disclosure.

The process starts at FIG. 3 with an incoming wafer having metal wiring. As shown in FIG. 3, the incoming wafer includes an inter-level dielectric (ILD) layer 20 having more than one electrode 22 formed therein and a capping layer 24 deposited on the ILD layer. The ILD layer 20 is any suitable dielectric film that may include organosilicate glass (SiCOH), fluoride silicate glass (FSG) or undoped silicate glass (USG). The electrodes 22 are a metal such as copper, however, other possible metals such as aluminum or tungsten can be used. The capping layer 24 is a dielectric film that is generally used to prevent oxidation and improve electro-migration. A non-exhaustive listing of materials used for the capping layer 24 may include silicon nitride, silicon carbide, or silicon carbon nitride (SiCN).

Figure 4:
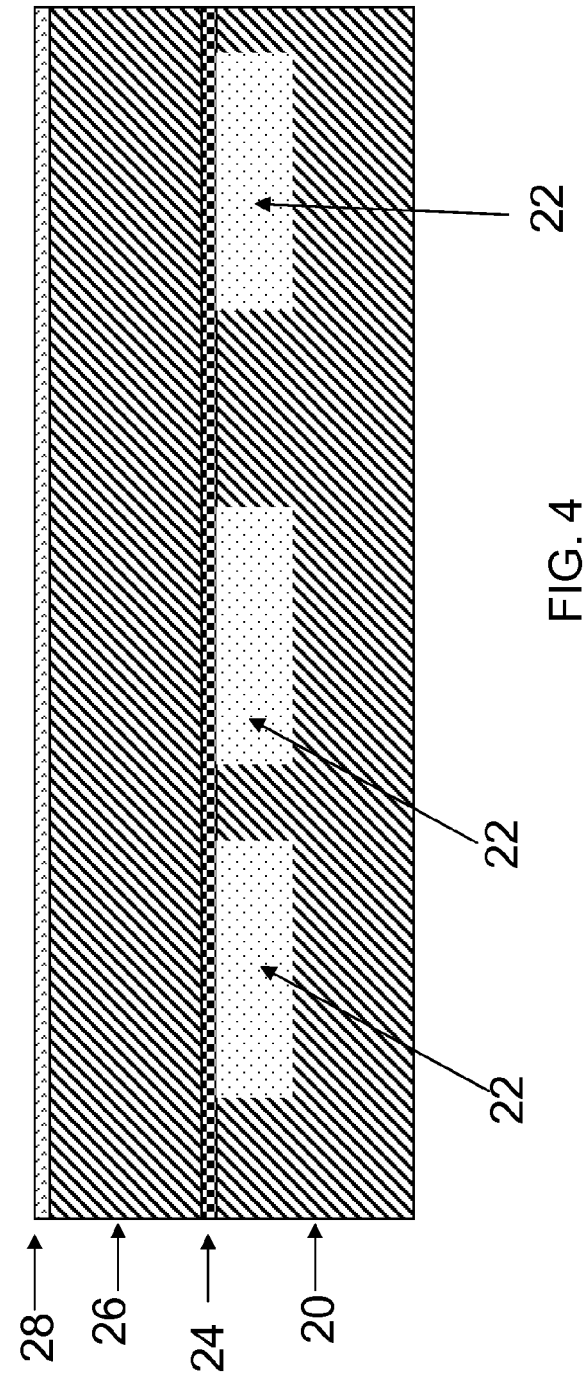

In FIG. 4, a second ILD layer 26 is deposited on the capping layer 24 and a hard mask dielectric layer 28 is deposited over the ILD layer 26. The ILD layer 26, like ILD layer 20, is a dielectric film that may include organosilicate glass (Si-COH), fluoride silicate glass (FSG) or undoped silicate glass (USG). The ILD layer 26 is deposited on the capping layer 24 using any suitable deposition technique that may include plasma enhanced chemical vapor deposition (PECVD), molecular CVD or spin-on technique. The hard mask dielectric layer 28 can be made of materials such as $SiO_2$, or $Si_3N_4$. The hard mask dielectric layer 28 is deposited on the ILD layer 26 using any suitable deposition technique that may include plasma enhanced chemical vapor deposition (PECVD), molecular CVD, or atomic layer deposition.

Figure 5:
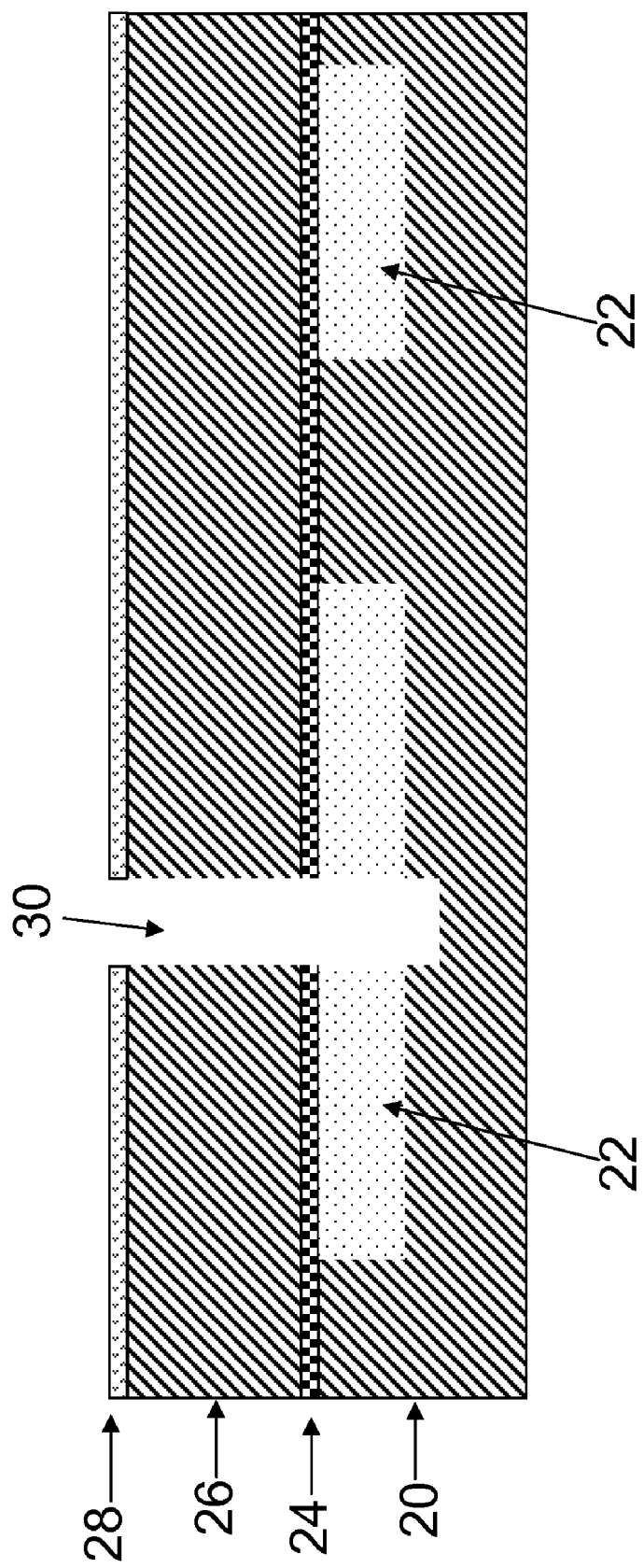

In FIG. 5, a cavity trench 30 is formed through the hard mask dielectric layer 28, the second ILD layer 26, the capping layer 24 to the first ILD layer 20, wherein the cavity trench is formed in the first ILD layer between two adjacent electrodes 22. The cavity trench 30 is formed by using a conventional back-end plasma reactive ion etching (RIE) technique to etch through the hard mask dielectric layer 28 and the second ILD layer 26, the capping layer 24 to the first ILD layer 20 between two adjacent electrodes 22.

Figure 6:
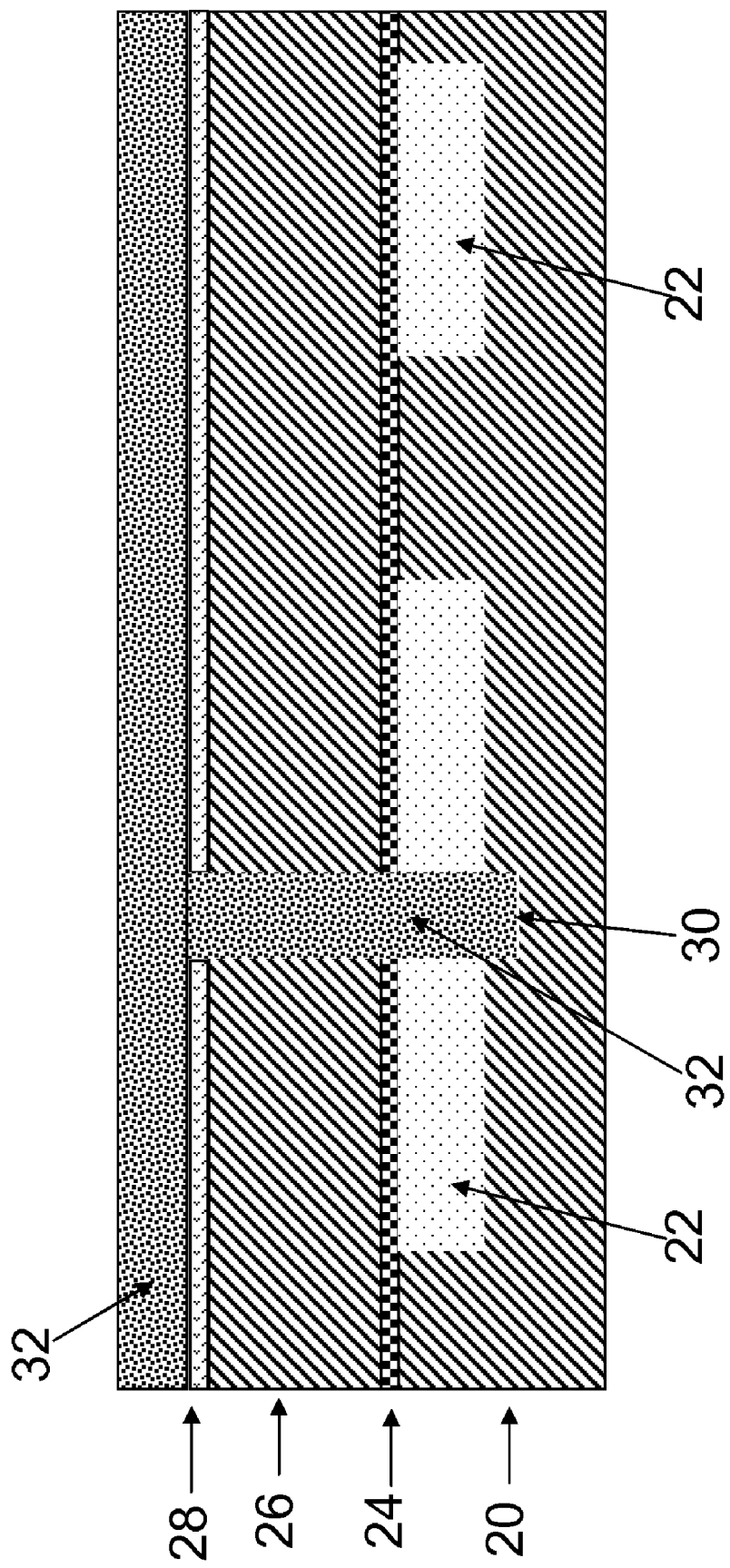

In FIG. 6, a sacrificial material 32 is deposited over the remaining hard mask dielectric layer 28 and fills the cavity trench 30. The sacrificial material 32 is preferably a carbon-based material, however, other materials such as anti-reflective coating materials that can withstand temperatures of more than 200° C. can be used. The sacrificial material 32 can be deposited by using a conventional deposition technique that may include a spin-on technique.

Figure 7:
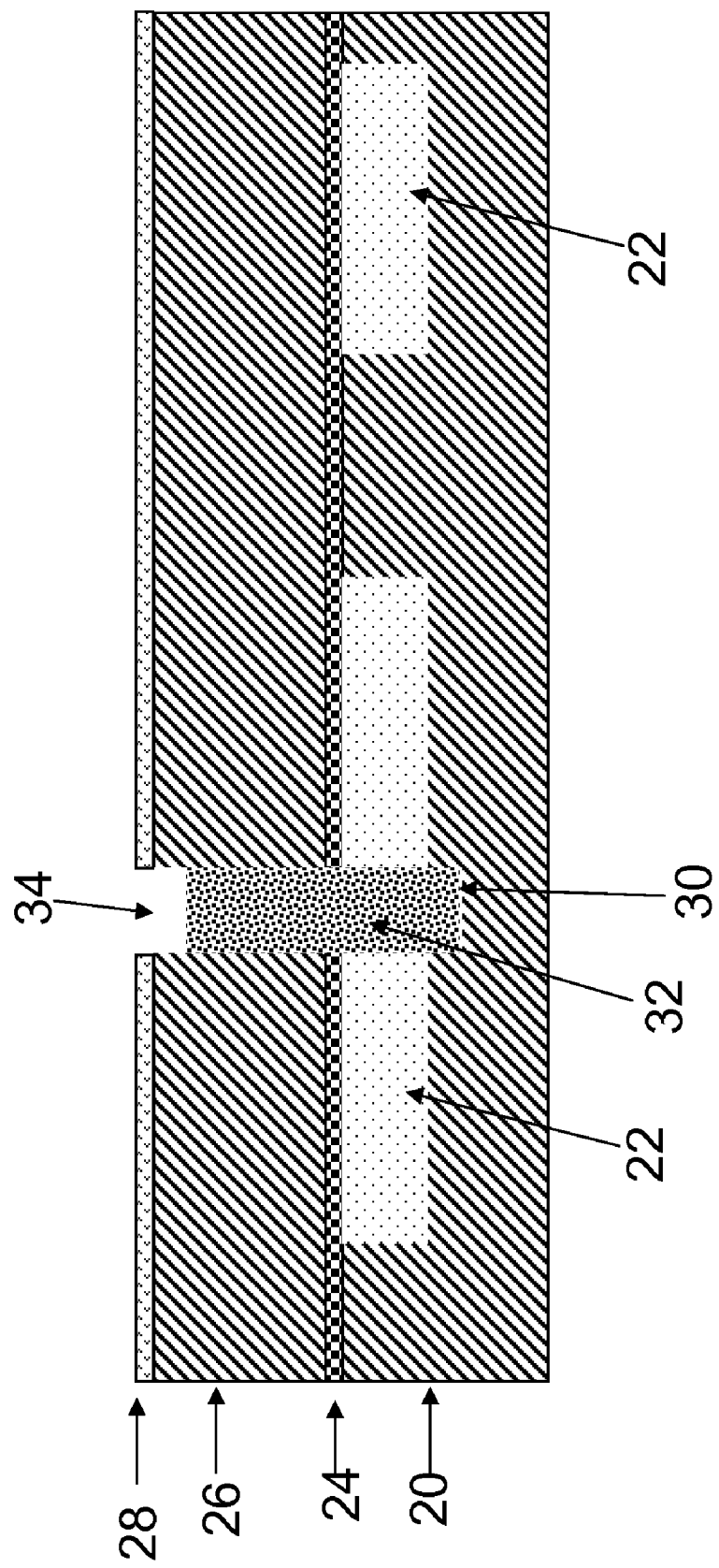

FIG. 7 shows the device after the sacrificial material 32 deposited over the remaining hard mask dielectric layer 28 has been planarized which results in a recess 34 formed in the cavity trench. A conventional planarization technique that may include an atomic oxygen plasma etch, or chemi-mechanical polish (CMP) is used to planarize the sacrificial material 32. Because it is desirable to ensure that no sacrificial material remains over the hard mask dielectric layer 28, slight over-etching occurs, resulting in the recess 34 about the cavity trench 30.

Figure 8:
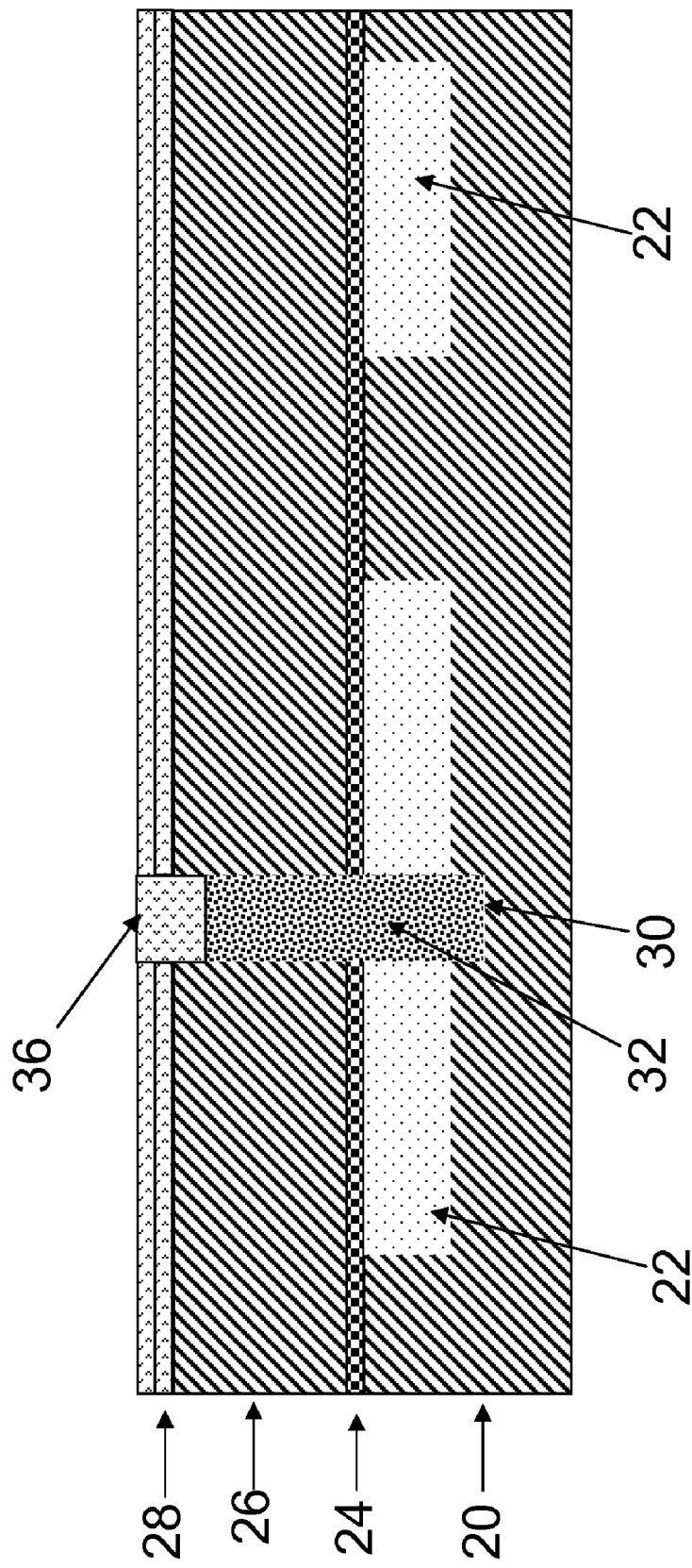

In FIG. 8, a second hard mask dielectric layer 36 is deposited over the first hard mask dielectric layer 28 which results in the recess 34 being filled. Like the first hard dielectric mask layer 28, the second hard mask dielectric layer 36 is made of materials such as $SiO_2$, or $Si_3N_4$ that can be deposited by a deposition technique that may include plasma enhanced chemical vapor deposition (PECVD), molecular CVD, or atomic layer deposition.

Figure 9:
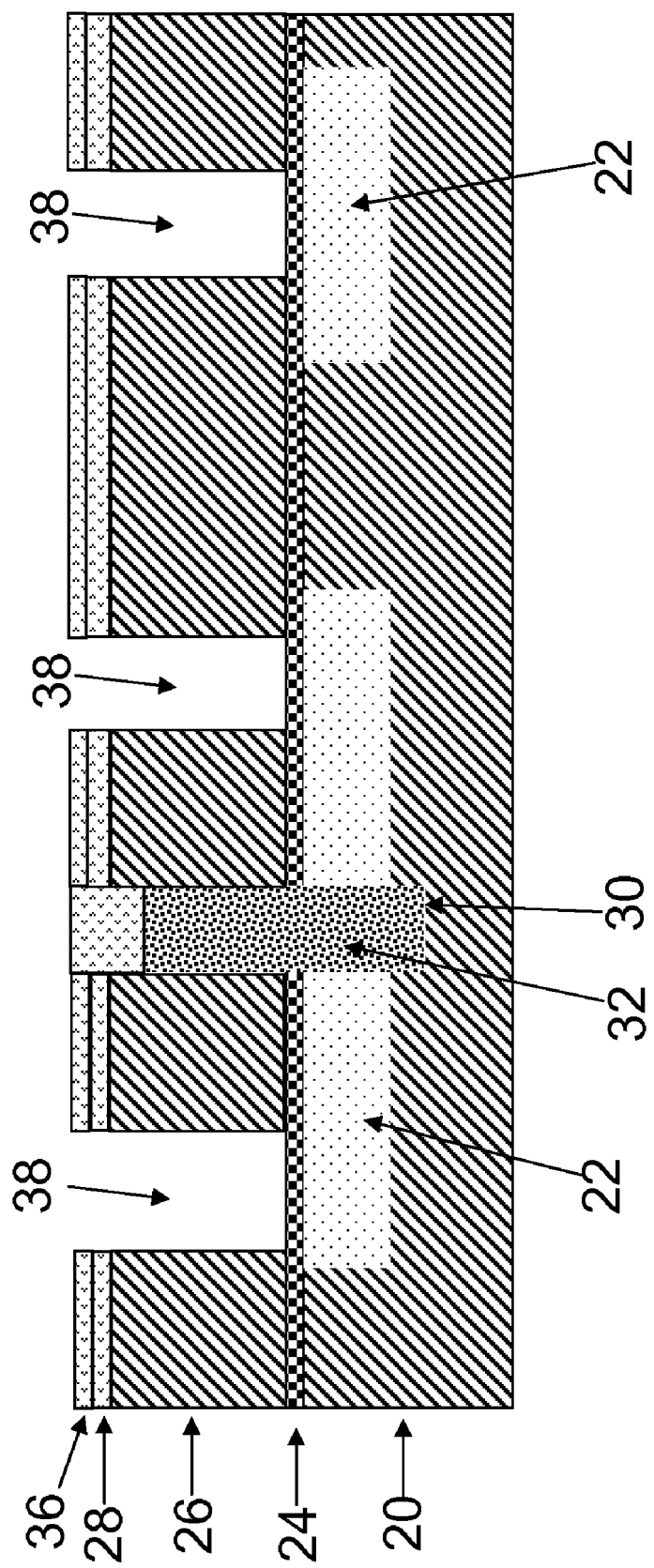

In FIG. 9, at least one via 38 is formed through portions of the masks 28 and 36, through the second ILD layer 26 to a top surface of the capping layer 24. The vias 38 are formed by using conventional lithography and etching techniques.

Figure 10:
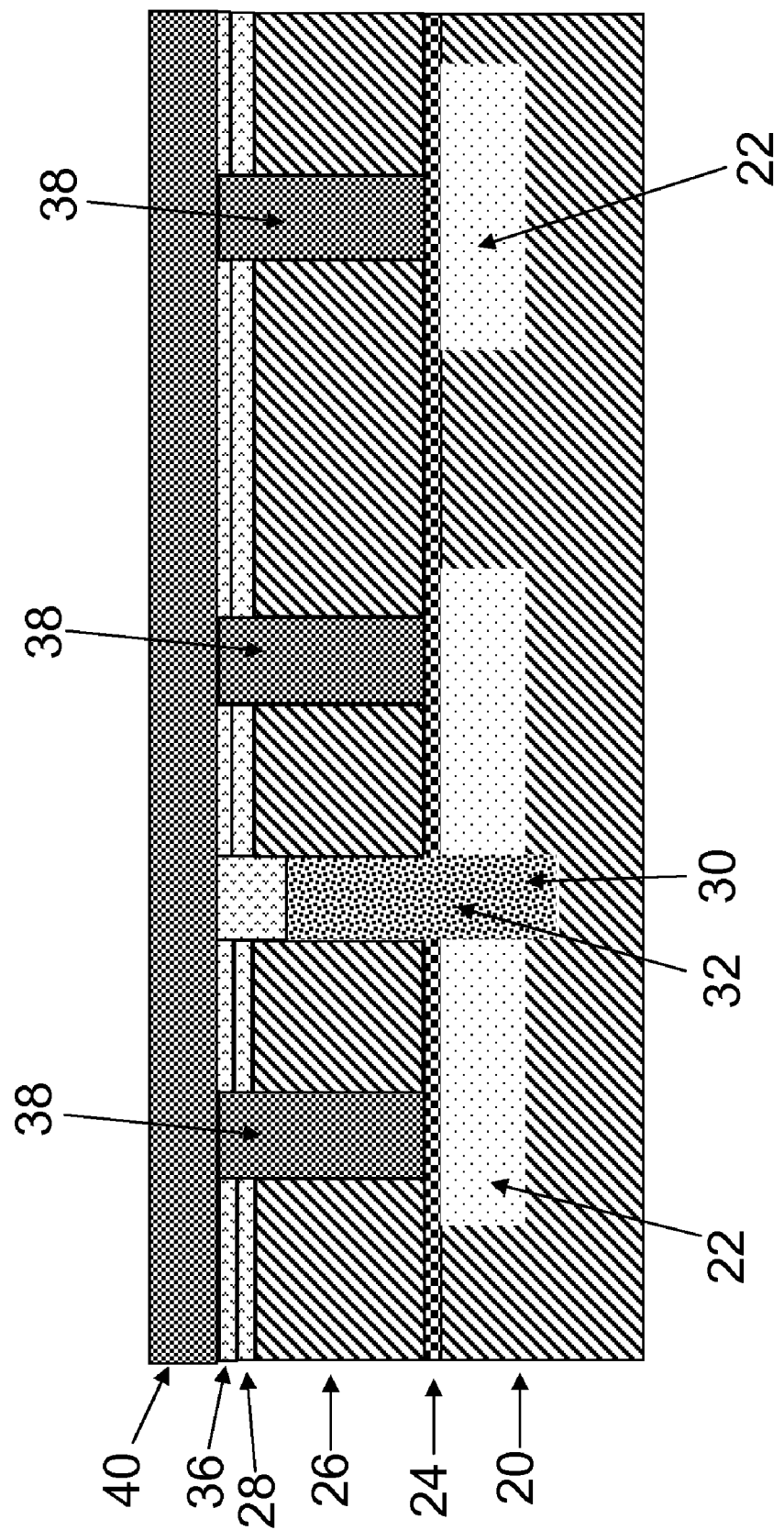

In FIG. 10, an anti-reflective coating (ARC) layer 40 is deposited over the hard mask dielectric layer 36 which results in the vias 38 being filled with the ARC material. Any suitable ARC material such as NFC (near frictionless carbon) film can be used as the ARC layer 40. The ARC layer 40 can be deposited by using a conventional deposition technique that may include a spin-on technique.

Figure 11:
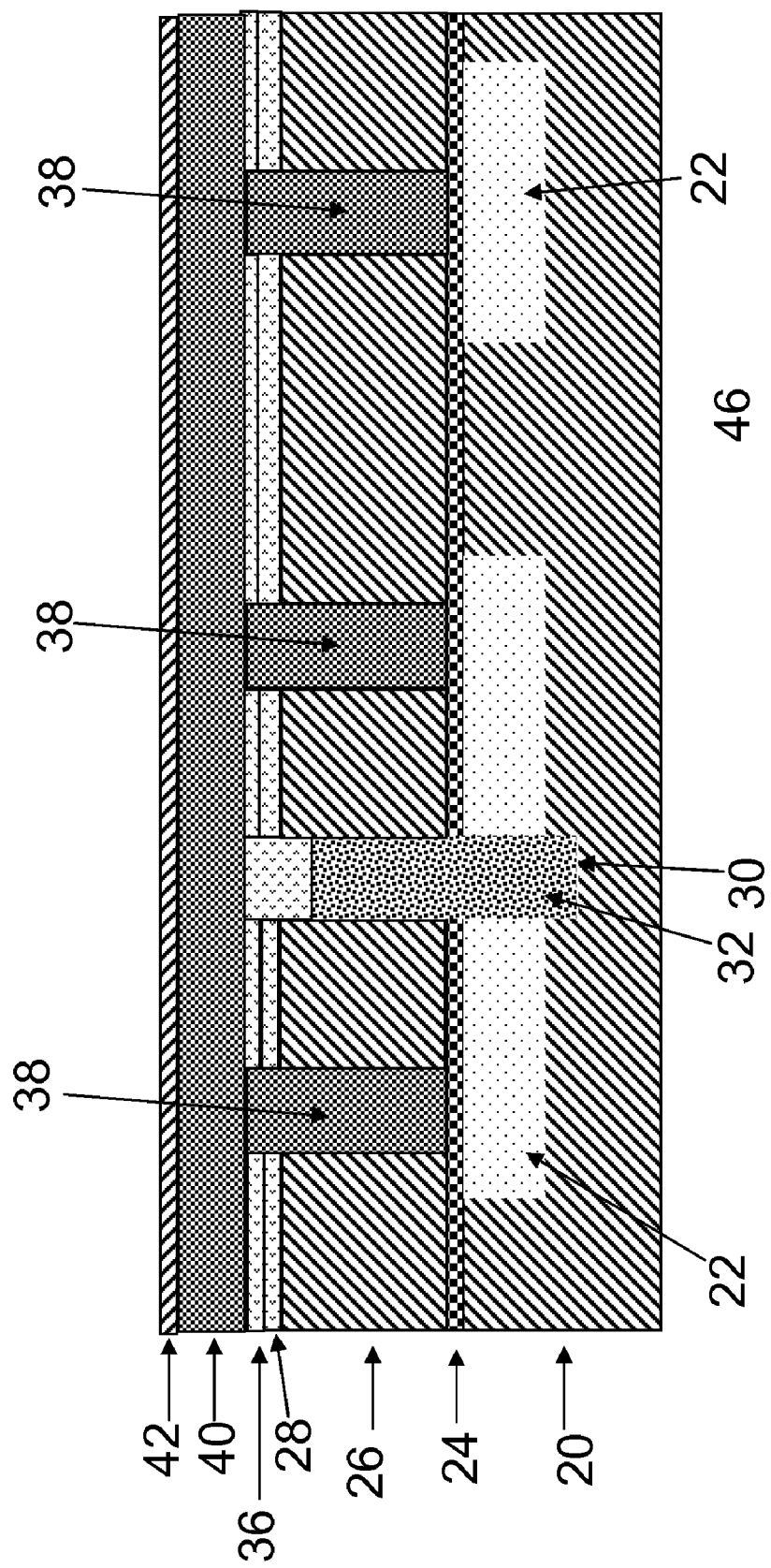

In FIG. 11, a dielectric layer 42 is deposited over the ARC layer 40. In one embodiment, the dielectric layer 42 is any low temperature dielectric that may include a low temperature oxide or nitride. The dielectric layer 42 can be deposited by using a conventional deposition technique such as plasma enhanced chemical vapor deposition (PECVD).

Figure 12:
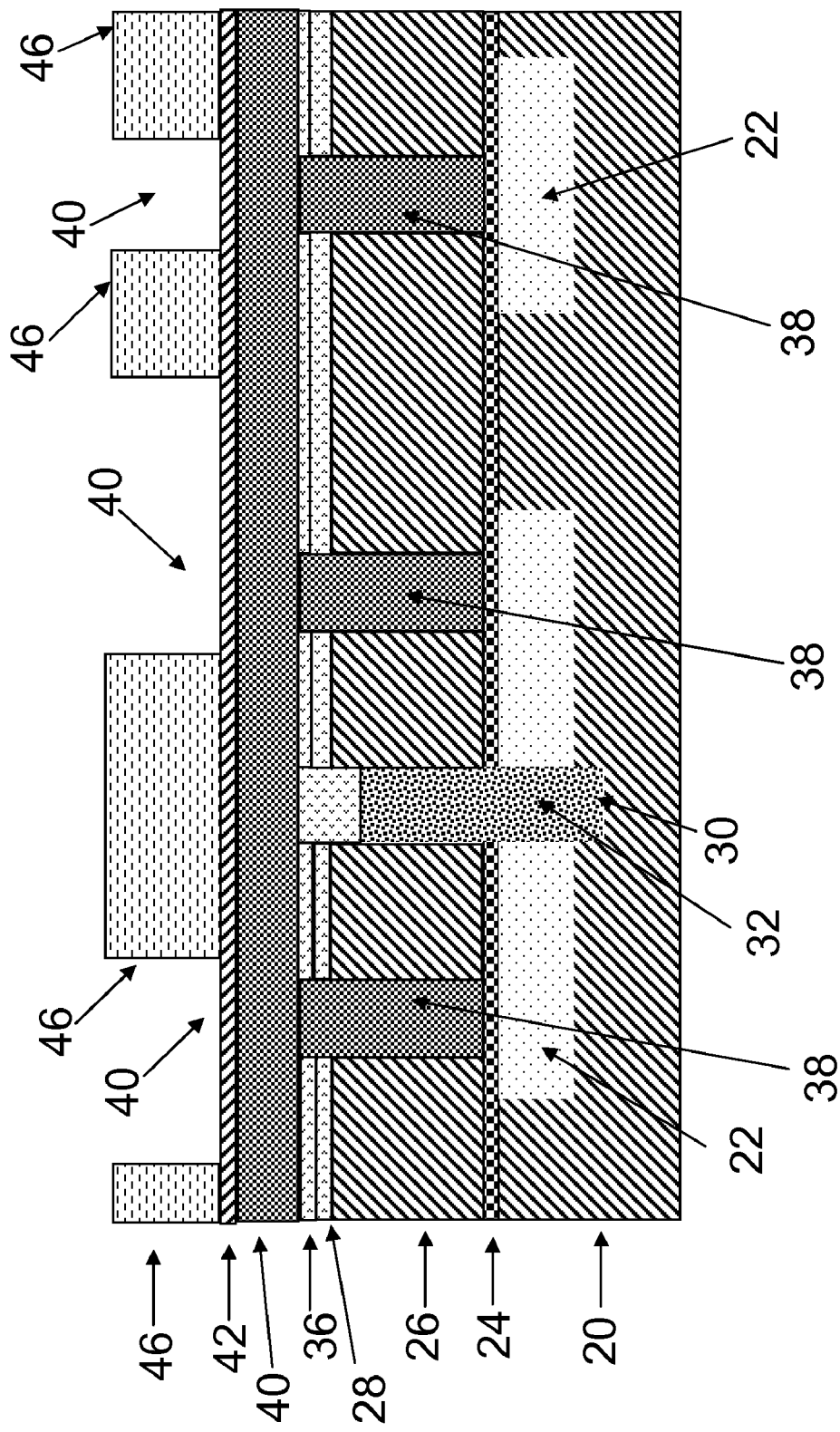
Figure 13:
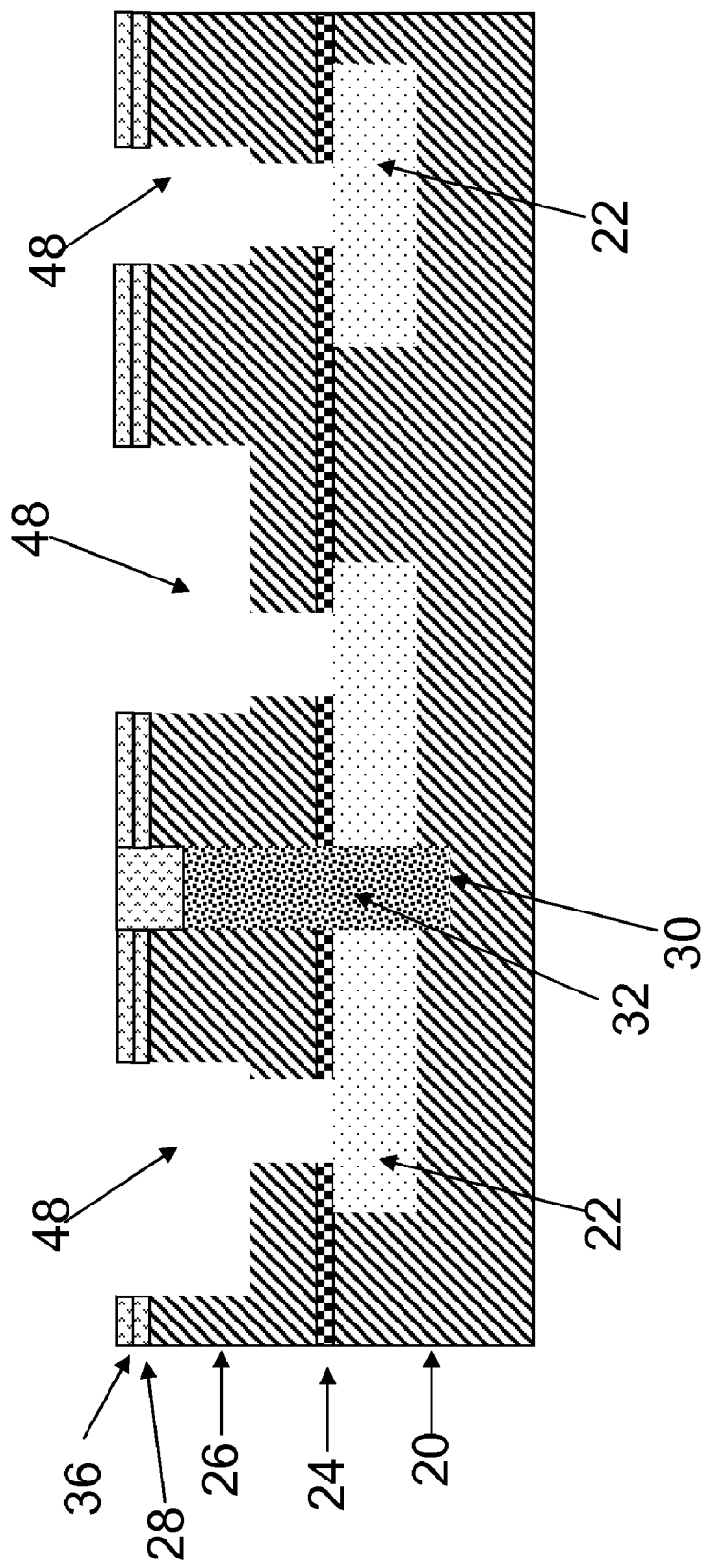
Figure 14:
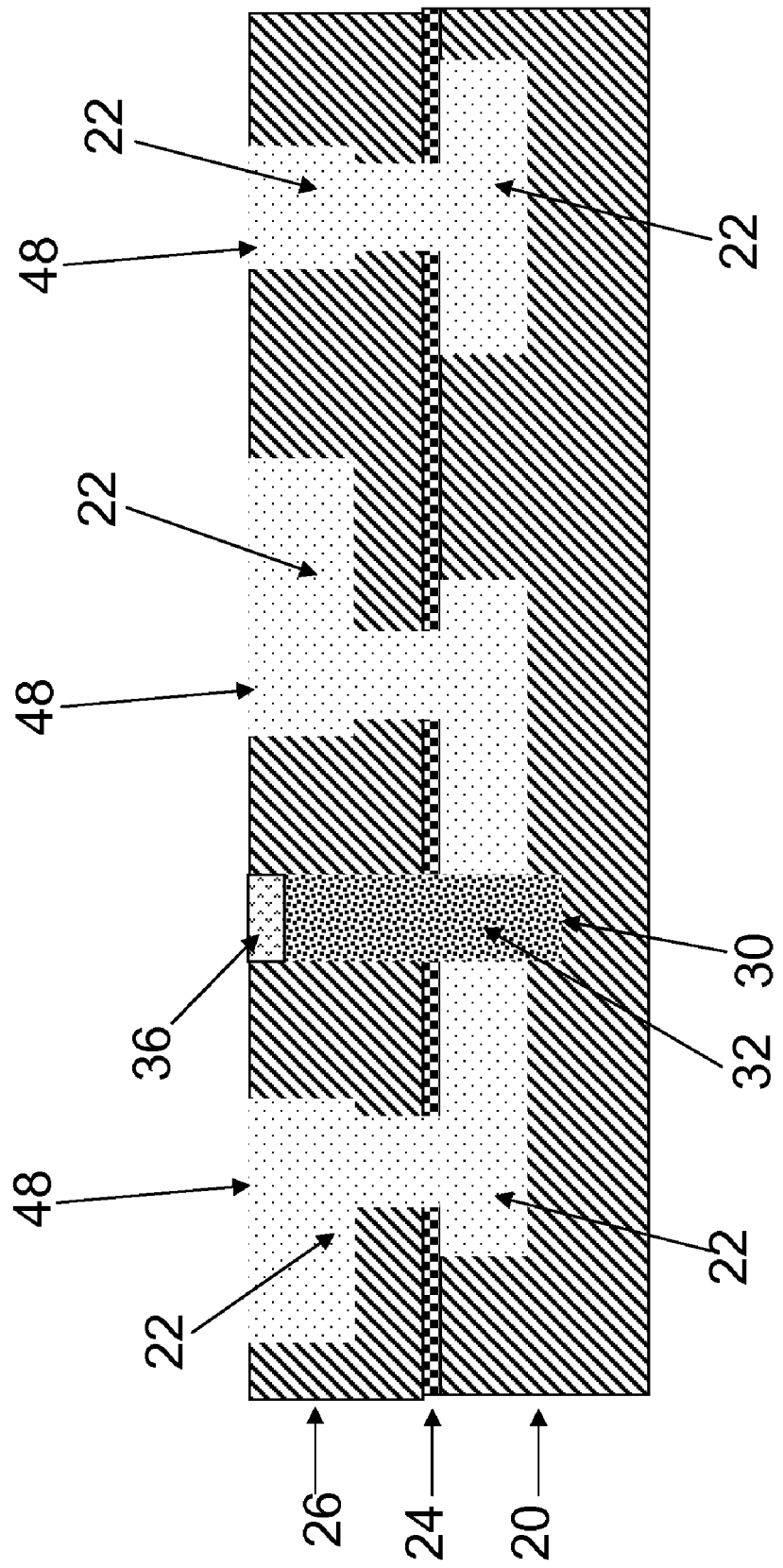

In FIGS. 12-14, a metal trench is formed around each of the vias. The metal trench is formed by applying a photoresist layer over the dielectric layer 42. The photoresist layer is exposed and developed forming patterns 46 through a conventional lithographic technique. As shown in FIG. 12, the lithography stops at the top surface of the dielectric layer 42. In FIG. 13, a trench 48 is formed about where the metal wire patterning was performed. In particular, a conventional etching technique is used to etch through the dielectric layer 42, the ARC layer 40, the hard mask dielectric layers 36 and 28, vias 38 filled with the ARC material and the capping layer 24 to the electrodes 22 in the first ILD layer 20. The resulting trenches are typical dual damascene trenches. The cavity trench 30 filled with the sacrificial material 32 remains as does the portion of the second hard mask dielectric layer 36 that filled the recess in that via. In FIG. 14, the trench 48 is filled with a metal 22 such as copper, however, other possible metals such as dual-damascene copper, tungsten or aluminum may be used. The metal deposited in the trench is deposited by using a conventional deposition technique that may include physical vapor deposition (PVD) or chemical vapor deposition (CVD).

Figure 15:
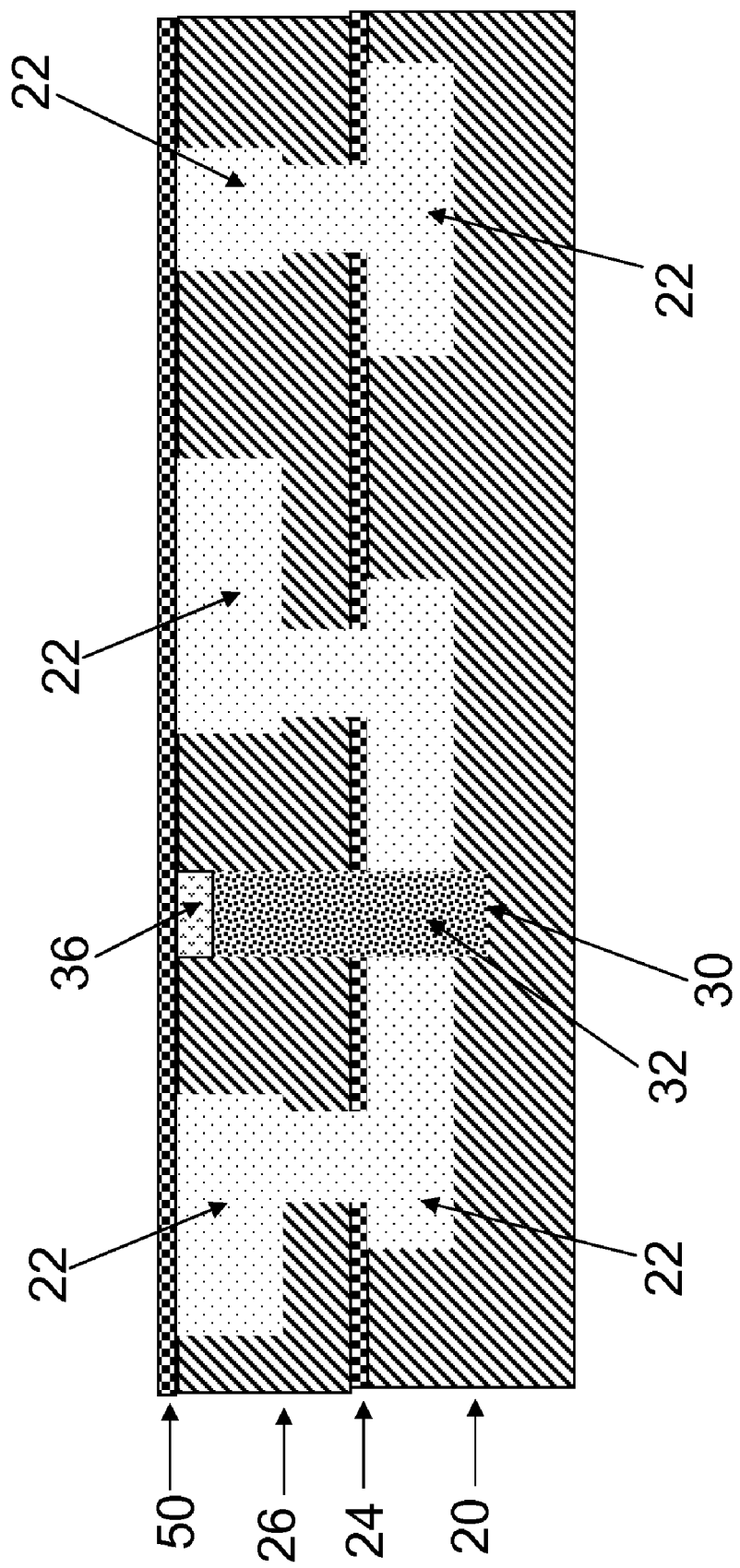

After filling the trench 48, the metal is polished and then a capping layer 50 is deposited as shown in FIG. 15. The capping layer 50 is deposited over the metal filled trenches as well as portions of the second ILD layer 26, and the second mask 36. The capping layer 50 is any type of dielectric film that can prevent oxidation and improve electro-migration. A non-exhaustive listing of materials used for the capping layer 50 may include silicon nitride, silicon carbide, or silicon carbon nitride (SiCN).

Figure 16:
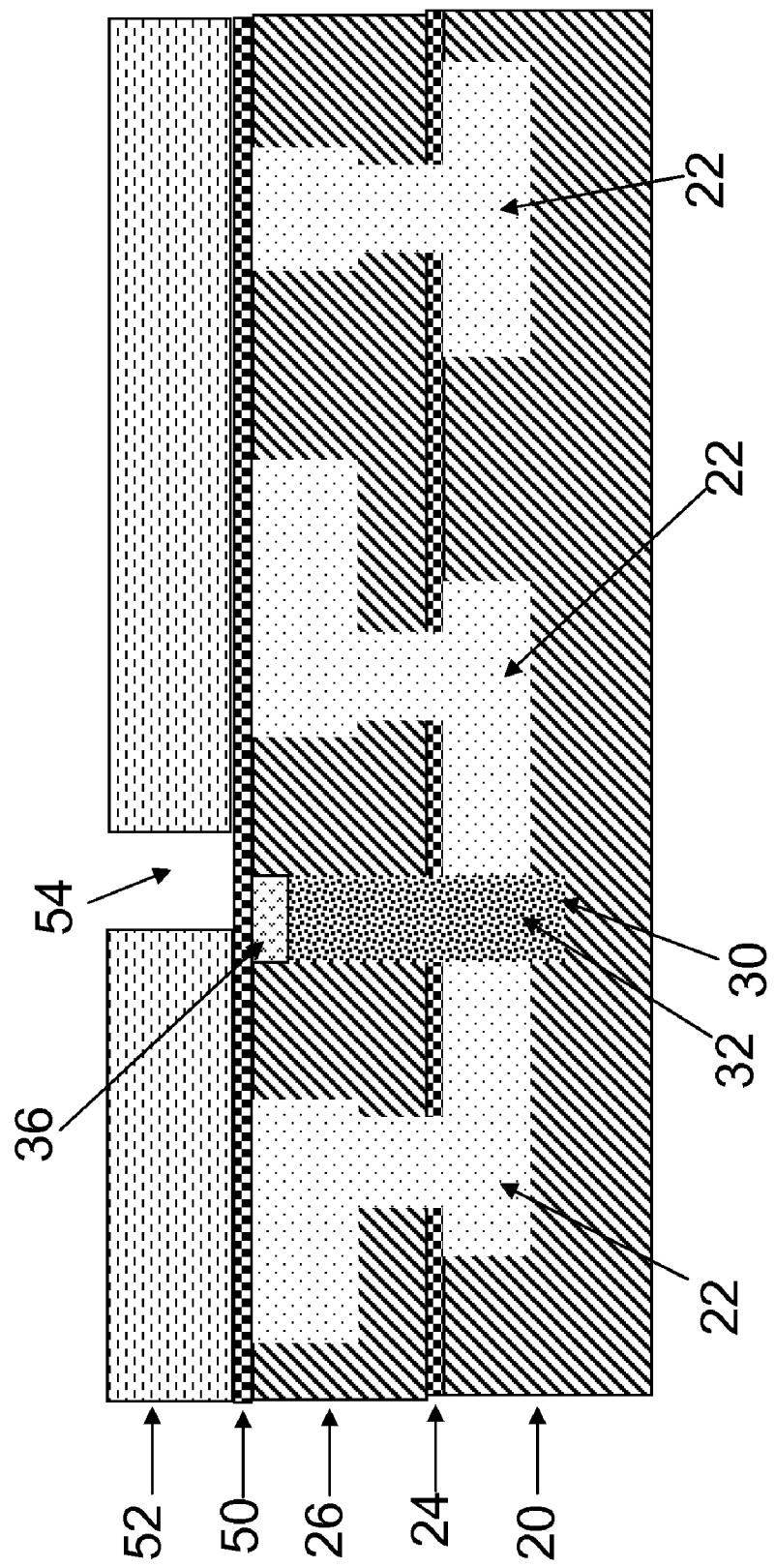
Figure 17:
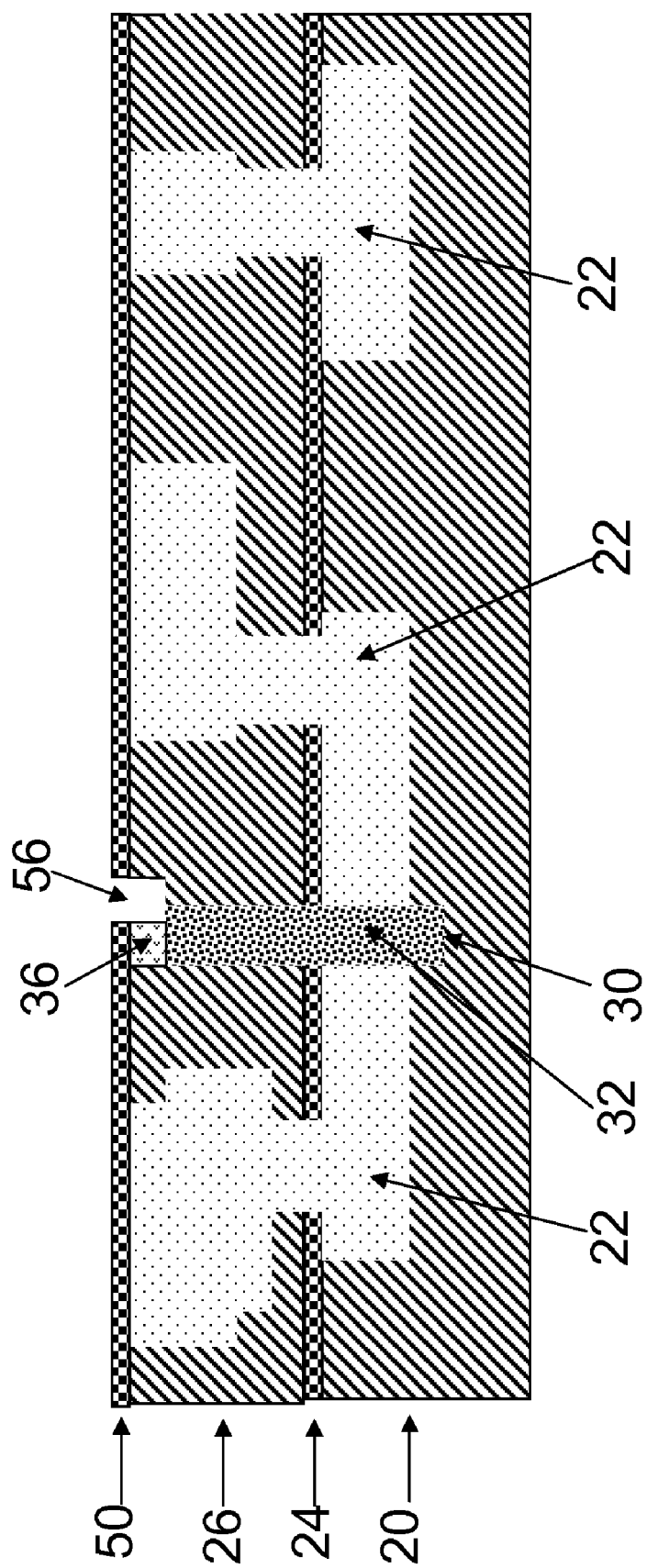

In FIGS. 16-17, a cavity release opening is formed over the top of the cavity trench 30. In particular, FIG. 16 shows that a photoresist layer 52 has been deposited over the capping layer 50 and an opening 54 is formed through a portion of the photoresist layer 52. The opening 54 is slightly off-center from the cavity trench 30. In FIG. 17, a conventional etching technique that may include a plasma RIE dry etch is used to etch an opening 56 through the capping layer 50 and a corner of the hard mask dielectric film 36 as well as a portion of the second ILD layer 26.

Figure 18:
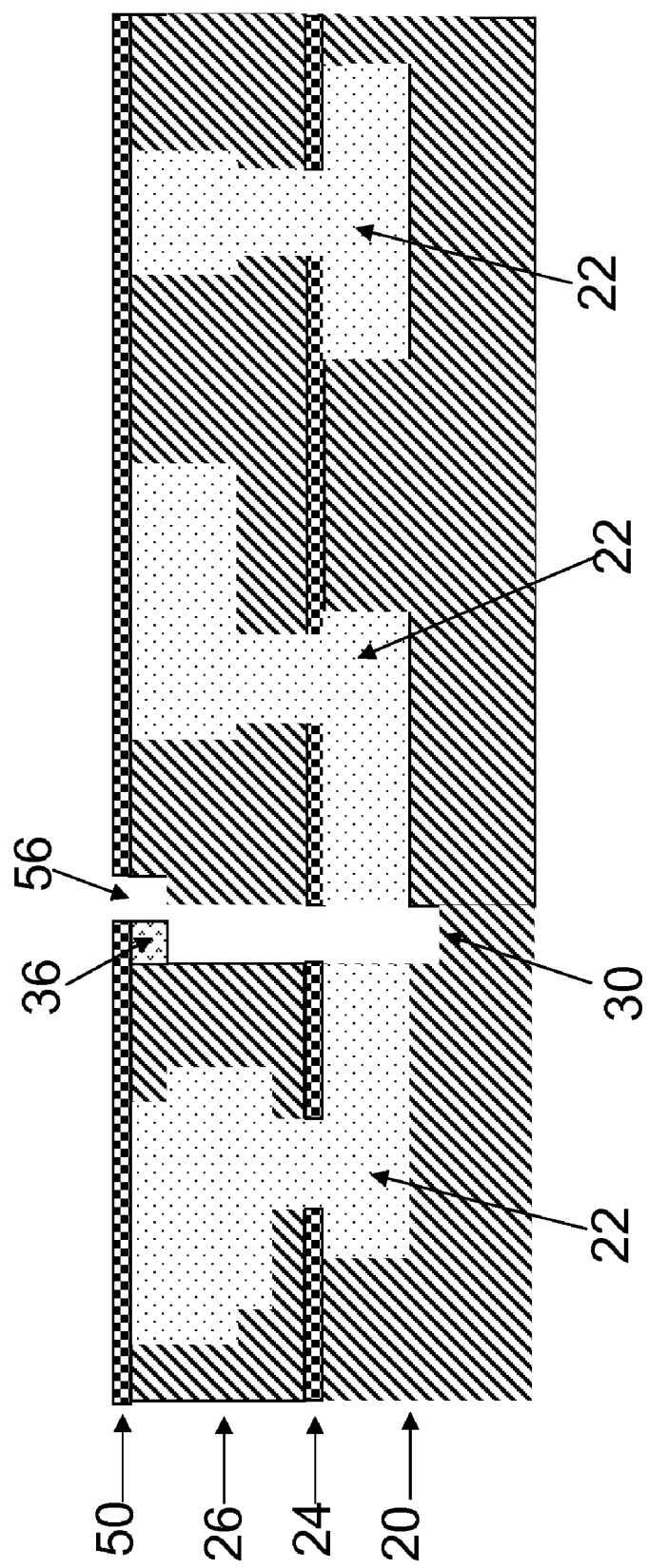
Figure 19:
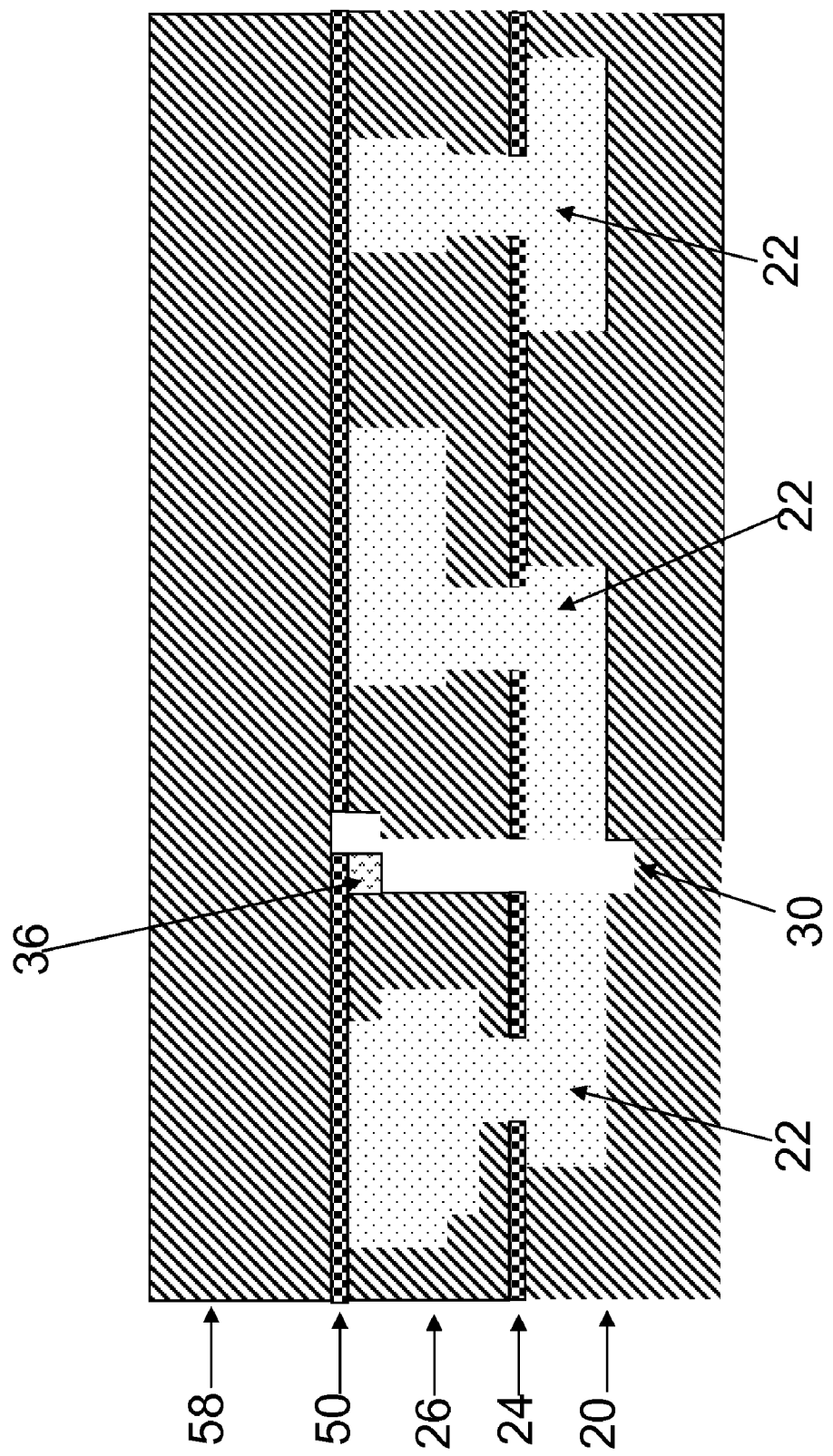

FIGS. 18-19 show the formation of the gap in the cavity trench 30 by extending the opening 56 therethrough. In particular, FIG. 18 shows that the remaining sacrificial material 32 in the cavity trench 30 has been removed. The remaining sacrificial material 32 is removed by a conventional etching technique that may include dry etching, or wet etch. FIG. 18 shows that after the etching has been performed a remaining portion of the hard mask dielectric film 36 is retained at a top portion in the cavity 30. In FIG. 19, a third ILD layer 58 is deposited over the capping layer 50 and the opening 56. The ILD layer 58 is a dielectric film that may include organosilicate glass (SiCOH), fluoride silicate glass (FSG) or undoped silicate glass (USG). The ILD layer 56 is deposited on the capping layer 50 using any suitable deposition technique that may include plasma enhanced chemical vapor deposition (PECVD), molecular CVD, or physical vapor deposition. The ILD layer 58 hermetically seals the cavity release opening 56 to provide the ESD protection. In one embodiment, the gap sealed in the cavity trench 30 may be air-filled or vacuum-filled. After forming the ESD device, it is integrated with an integrated circuit by coupling it to the pad of the circuit to provide the ESD protection against ESD events.

The foregoing process described in FIGS. 3-19 shows some of the processing functions associated with fabricating the ESD device. In this regard, each figure represents a process act associated with forming the ESD device. It should also be noted that in some alternative implementations, the acts noted in the figures may occur out of the order noted in the figures or, for example, may in fact be executed in different order, depending upon the acts involved. Also, one of ordinary skill in the art will recognize that additional figures that describe the formation of the ESD device may be added.

Figure 20:
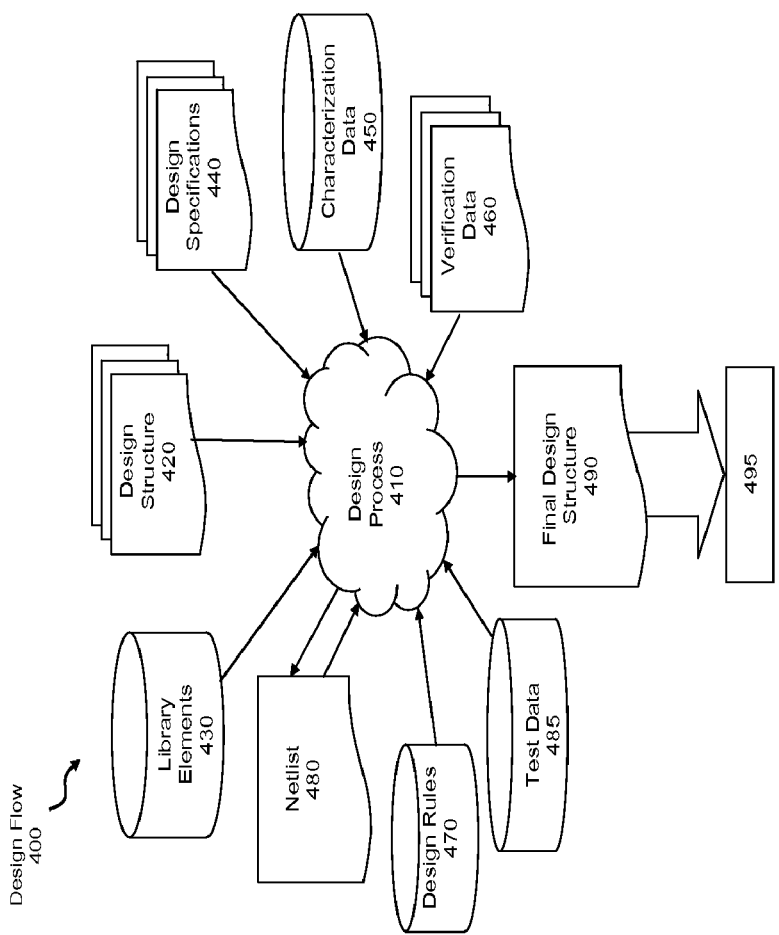
FIG. 20 shows a flow diagram describing a design process that can be used in the semiconductor design, manufacturing and/or test of the structures embodied in this disclosure.

FIG. 20 shows a block diagram of an exemplary design flow 400 used for example, in semiconductor design, manufacturing, and/or test. Design flow 400 may vary depending on the type of IC being designed. For example, a design flow 400 for building an application specific IC (ASIC) may differ from a design flow 400 for designing a standard component. Design structure 420 is preferably an input to a design process 410 and may come from an IP provider, a core developer, or other design company or may be generated by the operator of the design flow, or from other sources. Design structure 420 comprises an embodiment of the aspects shown in FIGS. 1-19 in the form of schematics or HDL, a hardware-description language (e.g., Verilog, VHDL, C, etc.). Design structure 420 may be contained on one or more machine readable medium. For example, design structure 420 may be a text file or a graphical representation of an embodiment of the aspects shown in FIGS. 1-19. Design process 410 preferably synthesizes (or translates) an embodiment of the aspects shown in FIGS. 1-19 into a netlist 480, where netlist 480 is, for example, a list of wires, transistors, logic gates, control circuits, I/O, models, etc., that describes the connections to other elements and circuits in an integrated circuit design and recorded on at least one of machine readable medium. This may be an iterative process in which netlist 480 is resynthesized one or more times depending on design specifications and parameters for the circuit.

Design process 410 may include using a variety of inputs; for example, inputs from library elements 430 which may house a set of commonly used elements, circuits, and devices, including models, layouts, and symbolic representations, for a given manufacturing technology (e.g., different technology nodes, 32 nm, 45 nm, 90 nm, etc.), design specifications 440, characterization data 450, verification data 460, design rules 470, and test data files 485 (which may include test patterns and other testing information). Design process 410 may further include, for example, standard circuit design processes such as timing analysis, verification, design rule checking, place and route operations, etc. One of ordinary skill in the art of integrated circuit design can appreciate the extent of possible electronic design automation tools and applications used in design process 410 without deviating from the scope and spirit of the disclosure. The design structure of the disclosure is not limited to any specific design flow.

Design process 410 preferably translates aspects shown in FIGS. 1-19, along with any additional integrated circuit design or data (if applicable), into a second design structure 490. Design structure 490 resides on a storage medium in a data format used for the exchange of layout data of integrated circuits and/or symbolic data format (e.g. information stored in a GDSII (GDS2), GLI, OASIS, map files, or any other suitable format for storing such design structures). Design structure 490 may comprise information such as, for example, symbolic data, map files, test data files, design content files, manufacturing data, layout parameters, wires, levels of metal, vias, shapes, data for routing through the manufacturing line, and any other data required by a semiconductor manufacturer to produce aspects shown in FIGS. 1-19. Design structure 490 may then proceed to a stage 495 where, for example, design structure 490: proceeds to tape-out, is released to manufacturing, is released to a mask house, is sent to another design house, is sent back to the customer, etc.

The integrated circuit chips that are integrated with the ESD device described herein can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It is apparent that there has been provided by this disclosure a design structure for an on-chip high frequency electro-static discharge device. While the disclosure has been particularly shown and described in conjunction with a preferred embodiment thereof, it will be appreciated that variations and modifications will occur to those skilled in the art. Therefore, it is to be understood that the appended claims are intended to cover all such modifications and changes as fall within the true spirit of the disclosure.

What is claimed is:

1. An electro-static discharge protection device fabricated on an integrated circuit, comprising:
    a first dielectric layer with more than one electrode formed therein;
    a second dielectric layer with more than one electrode formed therein located above the first dielectric layer;
    at least one via connects the more than one electrode in the first dielectric layer with the more than one electrode in the second dielectric layer;
    a gap formed through the first dielectric layer and the second dielectric layer, wherein the gap extends between two adjacent electrodes in both the first dielectric layer and the second dielectric layer, and wherein the gap comprises a main gap portion and a top gap portion thereover, the top gap portion being offset from the main gap portion;
    a hard mask dielectric layer located in the top gap portion near a top portion of the second dielectric layer, wherein the hard mask dielectric layer is disposed entirely within the gap; and
    a third dielectric layer disposed over the second dielectric layer, wherein the third dielectric layer hermetically seals the gap to provide electro-static discharge protection on the integrated circuit.

2. The device according to claim 1, wherein the hard mask dielectric layer comprises $SiO_2$, or $Si_3N_4$.

3. The device according to claim 1, further comprising a first capping layer disposed between the first dielectric layer and the second dielectric layer.

4. The device according to claim 3, further comprising a second capping layer disposed between the second dielectric layer and the third dielectric layer.

5. The device according to claim 4, wherein the first and second capping layer comprises silicon nitride, silicon carbide, or silicon carbon nitride.

6. The device according to claim 1, wherein the hermetically sealed gap is vacuum-filled.

7. The device according to claim 1, wherein the hermetically sealed gap is air-filled.

8. The device according to claim 1, wherein the more than one electrode and the at least one via formed in the first and second dielectric layer comprises copper.

9. The device according to claim 1, wherein the more than one electrode and the at least one via formed in the first and second dielectric layer comprises tungsten or aluminum.

10. An electro-static discharge protection device fabricated on an integrated circuit, comprising:
    a first dielectric layer with more than one electrode formed therein;
    a second dielectric layer with more than one electrode formed therein located above the first dielectric layer;
    a first capping layer disposed between the first dielectric layer and the second dielectric layer;
    at least one via connects the more than one electrode formed in the first dielectric layer through the first capping layer with the more than one electrode in the second dielectric layer;
    a gap formed through the first dielectric layer and the second dielectric layer, wherein the gap extends between two adjacent electrodes in both the first dielectric layer and the second dielectric layer and wherein the gap comprises a main gap portion and a top gap portion thereover, the top gap portion being offset from the main gap portion;
    a hard mask dielectric layer located in the top gap portion near a top portion of the second dielectric layer, wherein the hard mask dielectric layer is disposed entirely within the gap;
    a third dielectric layer disposed over the second dielectric layer, wherein the third dielectric layer hermetically seals the gap to provide electro-static discharge protection on the integrated circuit; and
    a second capping layer disposed between the second dielectric layer and the third dielectric layer.

* * * * *